US006875665B2

(12) United States Patent
Hokazono et al.

(10) Patent No.: US 6,875,665 B2
(45) Date of Patent: Apr. 5, 2005

(54) METHOD OF MANUFACTURING A SEMICONDUCTOR DEVICE

(75) Inventors: Akira Hokazono, Sagamihira (JP); Yoshiaki Toyoshima, Kashiwa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/611,985

(22) Filed: Jul. 3, 2003

(65) Prior Publication Data

US 2004/0094805 A1 May 20, 2004

Related U.S. Application Data

(62) Division of application No. 10/076,497, filed on Feb. 19, 2002, now Pat. No. 6,608,354.

(30) Foreign Application Priority Data

Dec. 19, 2001 (JP) .......................... 2001-386518

(51) Int. Cl.⁷ .......................... H01L 21/00; H01L 21/84; H01L 21/336
(52) U.S. Cl. ......................... 438/300; 438/149
(58) Field of Search ................. 438/299–305, 438/149–159; 257/382–412

(56) References Cited

U.S. PATENT DOCUMENTS 3,887,993 A    6/1975  Okada et al.
3,959,025 A    5/1976  Polinsky
6,150,221 A   11/2000  Aoyama
6,165,826 A * 12/2000  Chau et al. .................. 438/305
6,455,366 B1 *  9/2002  Lee ............................. 438/300

FOREIGN PATENT DOCUMENTS

JP          10-233456          9/1998

* cited by examiner

Primary Examiner—Cuong Nguyen
(74) Attorney, Agent, or Firm—Oblon, Spivak, McClelland, Maier & Neustadt, P.C.

(57) ABSTRACT

An aspect of the present invention includes a first MOSFET having a first gate electrode formed on a first semiconductor layer in a first region of a semiconductor substrate, a first channel region formed immediately below the first gate electrode in the first semiconductor layer, a first diffusion layer constituting source/drain regions formed at both the sides of the first channel region in the first semiconductor layer, a first epitaxial layer formed on the first diffusion layer, and a first silicide layer formed on the first epitaxial layer, and a second MOSFET having a second gate electrode formed on a second semiconductor layer in a second region of the semiconductor substrate, a second channel region formed immediately below the second gate electrode in the second semiconductor layer, a second diffusion layer constituting source/drain regions formed at both the sides of the second channel region in the second semiconductor layer, and a second silicide layer formed on the second diffusion layer.

4 Claims, 12 Drawing Sheets

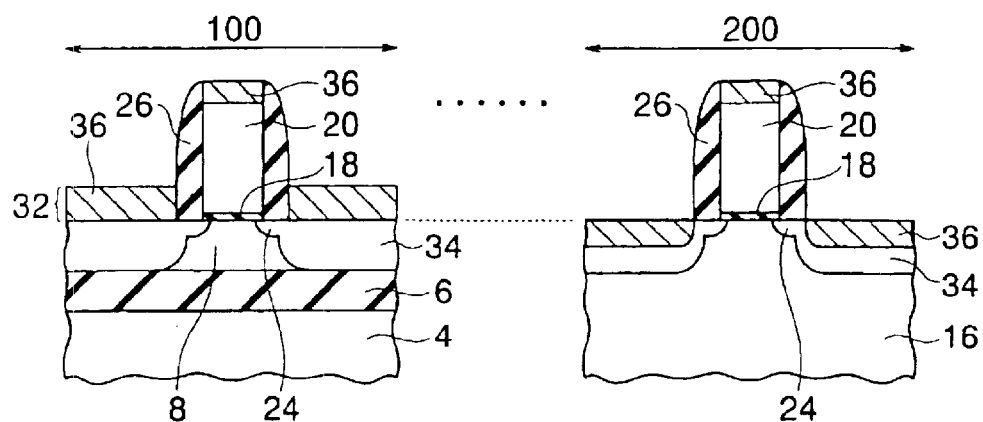
F I G. 1
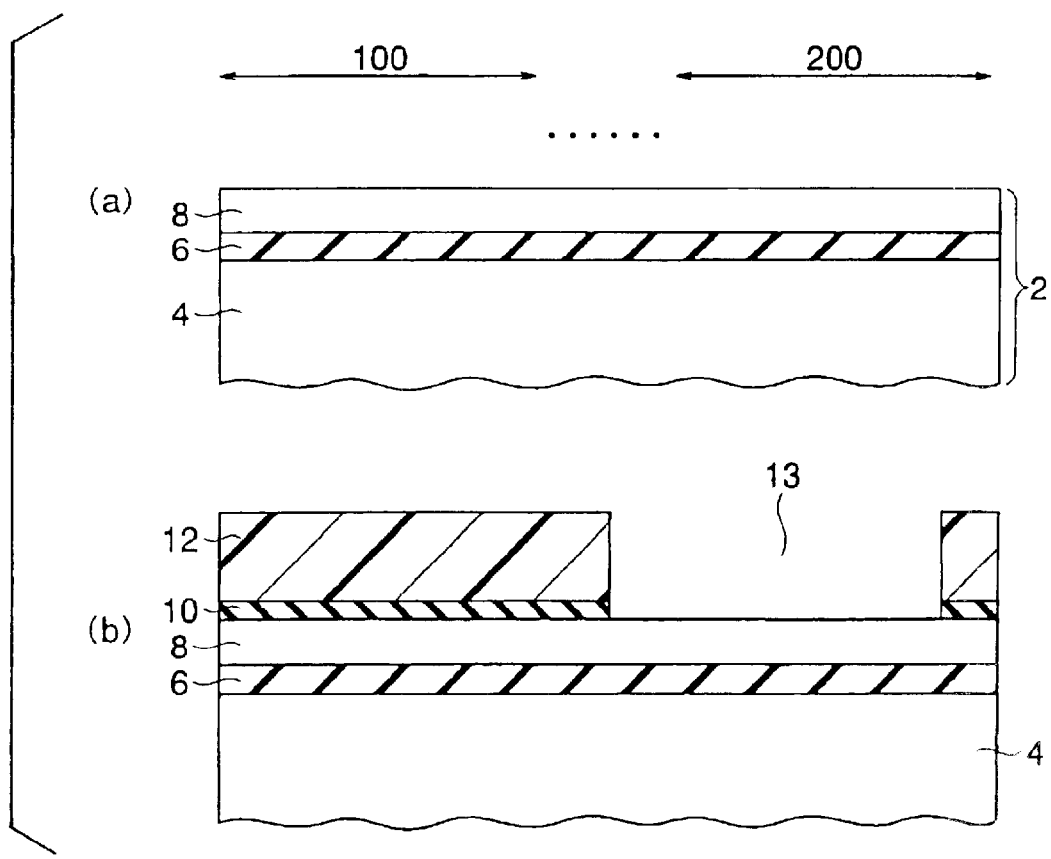
F I G. 2

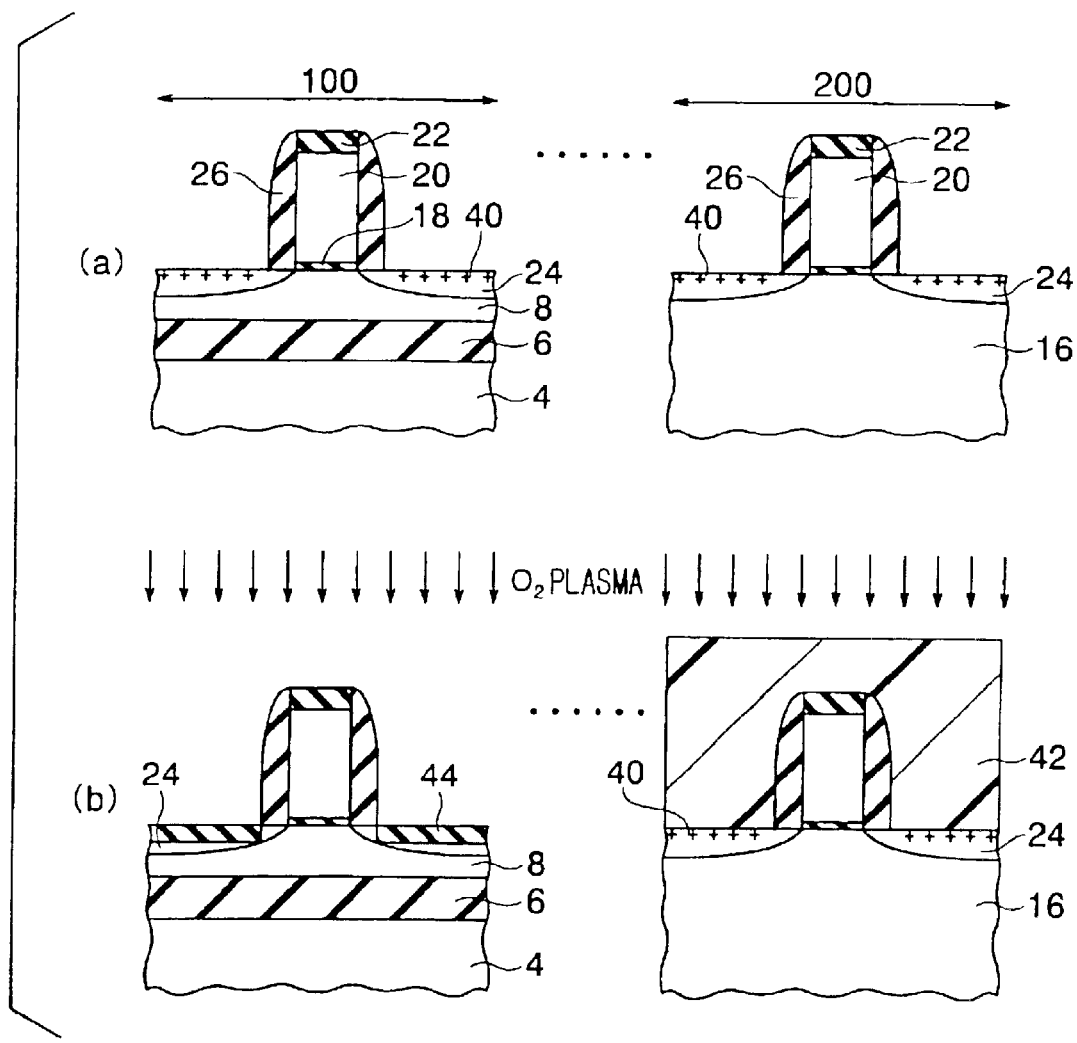
F I G. 6

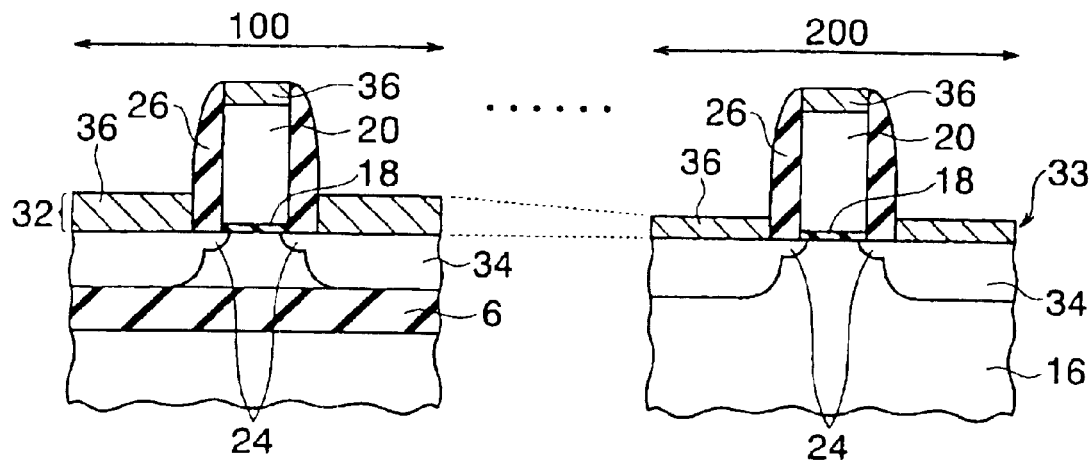
F I G. 8
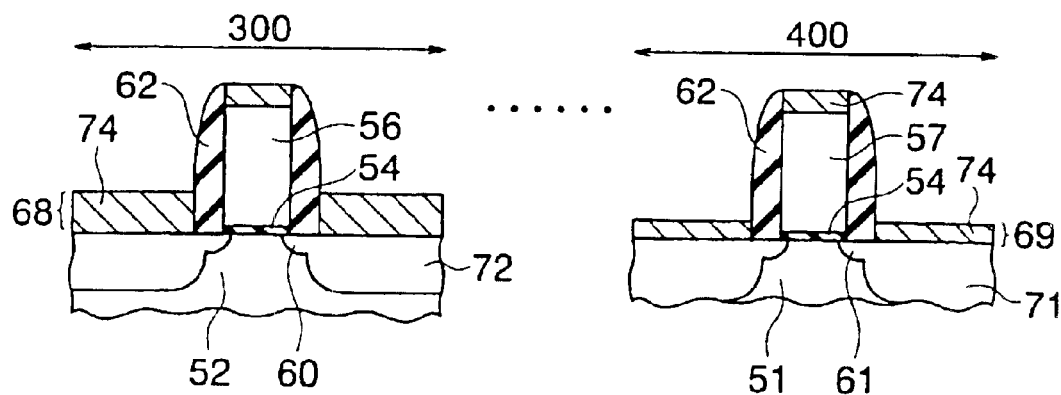
F I G. 9

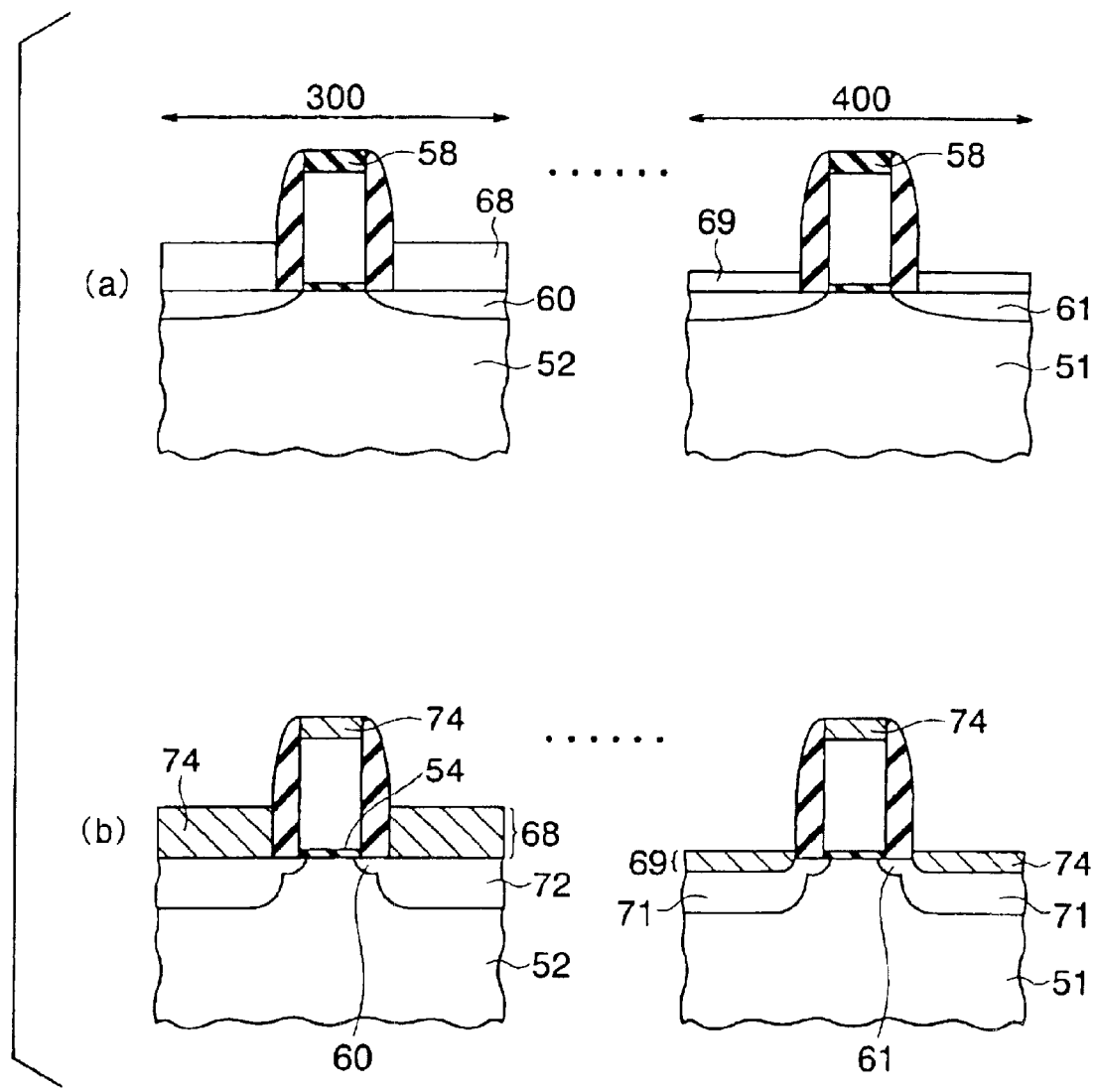
F I G. 11

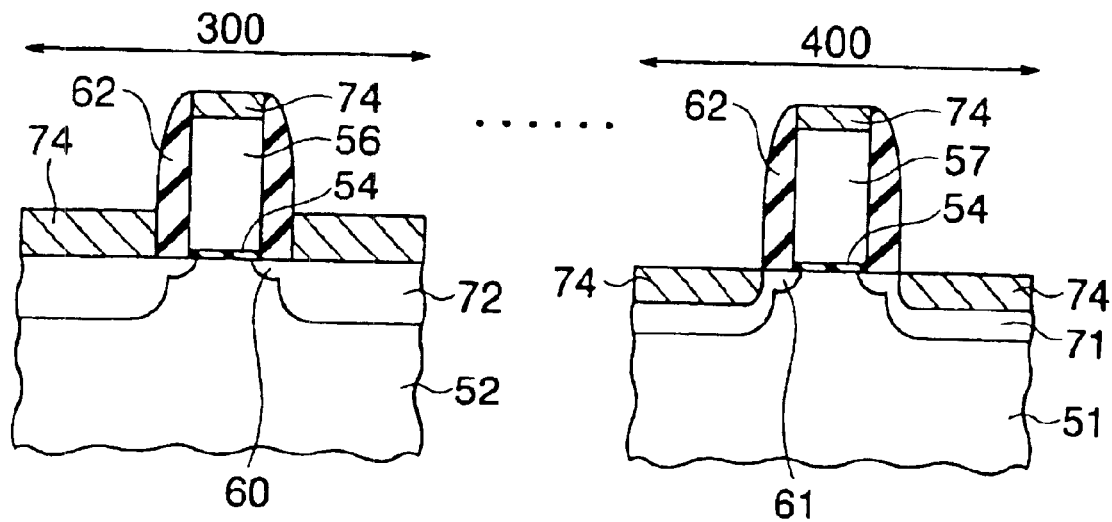
F I G. 14

US 6,875,665 B2

METHOD OF MANUFACTURING A SEMICONDUCTOR DEVICE

CROSS-REFERENCE TO RELATED APPLICATION

This application is a divisional application of, and claims priority to, Ser. No. 10/076,497, filed Feb. 19, 2002 now U.S. Pat. No. 6,608,354 and claims the benefit of priority from the prior Japanese Patent Application No. 2001-386518, filed Dec. 19, 2001; the entire contents of which are incorporated herein by reference.

BACKGROUND OF THE INVENTION

1. Field of the Invention

The present invention relates to a semiconductor device and a method of manufacturing the same.

2. Related Background Art

Recently, as the miniaturization of semiconductor devices advances, gate widths of MOSFETs have become shorter, and the thicknesses of gate sidewalls composed of insulating layers and formed at side portions of gate electrodes have become thinner. In a semiconductor device having a MOSFET with a thin gate sidewall, a problem may arise that a deep diffusion layer constituting source/drain regions of the MOSFET tends to shift toward the gate electrode side. In order to avoid this problem, it is necessary to shallow the diffusion layer constituting source/drain regions.

Further, generally, a silicide layer is formed in source/drain regions in order to reduce parasitic resistance. In such a case, if the diffusion layer constituting the source/drain regions is caused to be shallow, the distance between the silicide layer bottom and the diffusion layer is shortened, thereby junction leakage current is increased. On the contrary, if the diffusion layer is caused to be deep, the short channel effect is deteriorated.

In order to avoid this, it is necessary to elevate or lift the diffusion layer. FIG. 15 shows the structure of an MOSFET having an elevated diffusion layer. In FIG. 15, an insulating layer 91 is formed on a semiconductor substrate or a well 90, and a gate electrode 92 of polycrystalline silicon is formed on the insulating layer 91. A gate sidewall 95 is formed at the side portion of the gate electrode 92. In the well immediately below the gate electrode 92, a channel region is formed, and at both the sides of the channel region in the well, a diffusion layer 94 serving as source and drain is formed. A shallow diffusion layer 93 (hereinafter also referred to as "extension region 93") with a lower impurity concentration than the diffusion layer 94 is formed between the channel region and the diffusion layer 94. A silicon layer 96 is formed by epitaxial growth on the diffusion layer 94. Silicidation of the silicon layer 96 is then performed to form a silicide layer 97. With the MOSFET thus constituted, it is possible to inhibit the occurrence of junction leakage current even if miniaturization takes place. Accordingly, it is possible to prevent the degradation of short-channel effect.

However, there is a problem in making all the MOSFETs formed on a semiconductor substrate with an elevated structure. For example, in some circuit area, epitaxial growth may not be needed. Further, it may not be necessary to form all the MOSFETs with epitaxial layers having the same thickness.

For example, it is assumed that a logical circuit region and a DRAM (Dynamic Random Access Memory) region are mixedly formed on an SOI (Silicon On Insulator) substrate. In this case, a DRAM is formed in a DRAM forming area made by removing a portion of the SOI substrate, on which the DRAM is to be formed, together with the buried oxide layer, and by filing that portion with silicon; a number of logical circuits are formed on the SOI region without removing the buried oxide layer. Since there is a tendency to make thinner the thickness of silicon layer of an SOI substrate, on which a MOSFET is to be formed, to form a fully depleted MOSFET, it is necessary to form an epitaxial layer on a diffusion layer serving as source and drain in a MOSFET formed in an SOI region in order either to form a silicide layer on the diffusion layer or to reduce the sheet resistance of the diffusion layer under the silicide layer. On the other hand, however, it is not necessary to form an epitaxial layer by epitaxial growth in regions other than the SOI region (for example, a region in which the DRAM is formed). The reason for this is that if the optimization is not made in accordance with the thickness of epitaxial layer, junction capacitance may be increased, or parasitic resistance may be increased, thereby causing a problem that device characteristic or circuit performance is degraded.

Further, it is known that an n-channel MOSFET, which tends to form a rapid profile, does not need a thick epitaxial layer like a p-channel MOSFET. Since there is an optimum thickness of epitaxial layer for each type of MOSFET, if the thickness of epitaxial layer is uniformly set, the diffusion layer of one type of MOSFET is caused to be shallow, thereby increasing parasitic capacitance. Accordingly, a problem may arise that device characteristic and circuit performance are degraded.

SUMMARY OF THE INVENTION

A semiconductor device according to a first aspect of the present invention includes: a first MOSFET including: a first gate electrode formed on a first semiconductor layer in a first region of a semiconductor substrate; a first channel region formed immediately below the first gate electrode in the first semiconductor layer; a first diffusion layer constituting source/drain regions formed at both the sides of the first channel region in the first semiconductor layer; a first epitaxial layer formed on the first diffusion layer; and a first silicide layer formed on the first epitaxial layer; and a second MOSFET including: a second gate electrode formed on a second semiconductor layer in a second region of the semiconductor substrate; a second channel region formed immediately below the second gate electrode in the second semiconductor layer; a second diffusion layer constituting source/drain regions formed at both the sides of the second channel region in the second semiconductor layer; and a second silicide layer formed on the second diffusion layer.

A semiconductor device according to a second aspect of the present invention includes: a first MOSFET including: a first gate electrode formed on a first semiconductor layer in a first region of a semiconductor substrate; a first channel region formed immediately below the first gate electrode in the first semiconductor layer; a first diffusion layer constituting source/drain regions formed at both the sides of the first channel region in the first semiconductor layer; a first epitaxial layer formed on the first diffusion layer; and a first silicide layer formed on the first epitaxial layer; and a second MOSFET including: a second gate electrode formed on a second semiconductor layer in a second region of the semiconductor substrate; a second channel region formed immediately below the second gate electrode in the second semiconductor layer; a second diffusion layer constituting source/drain regions formed at both the sides of the second channel region in the second semiconductor layer; a second epitaxial layer, which is thinner than the first epitaxial layer, formed on said second diffusion layer; and a second silicide layer formed on the second epitaxial layer.

A method of manufacturing a semiconductor device according to a third aspect of the present invention includes: forming a first gate electrode on a first semiconductor layer in a first region of a semiconductor substrate, and a second gate electrode on a second semiconductor layer in a second region of the semiconductor substrate; forming a first diffusion layer in the first semiconductor layer using the first gate electrode as a mask, and a second diffusion layer in the second semiconductor layer using the second gate electrode as a mask; and selectively forming an epitaxial layer only on the first diffusion layer.

BRIEF DESCRIPTION OF THE DRAWINGS

FIG. 1 is a sectional view showing the structure of a semiconductor device according to a first embodiment of the present invention.

FIGS. 2(a) and 2(b) are sectional views of a stage of the manufacturing process with respect to a method of manufacturing a semiconductor device according to a second embodiment of the present invention.

FIGS. 6(a) and 6(b) are sectional views of a stage of the manufacturing process with respect to a method of manufacturing a semiconductor device according to a third embodiment of the present invention.

FIG. 8 is a sectional view showing the structure of a semiconductor device according to a fourth embodiment of the present invention.

FIG. 9 is a sectional view showing the structure of a semiconductor device according to a fifth embodiment of the present invention.

FIGS. 11(a) and 11(b) are sectional views of another stage of the manufacturing process with respect to the method of manufacturing a semiconductor device according to the sixth embodiment of the present invention.

FIG. 14 is a sectional view showing the structure of a semiconductor device according to an eighth embodiment of the present invention.

DESCRIPTION OF THE EMBODIMENTS

Figure 3:
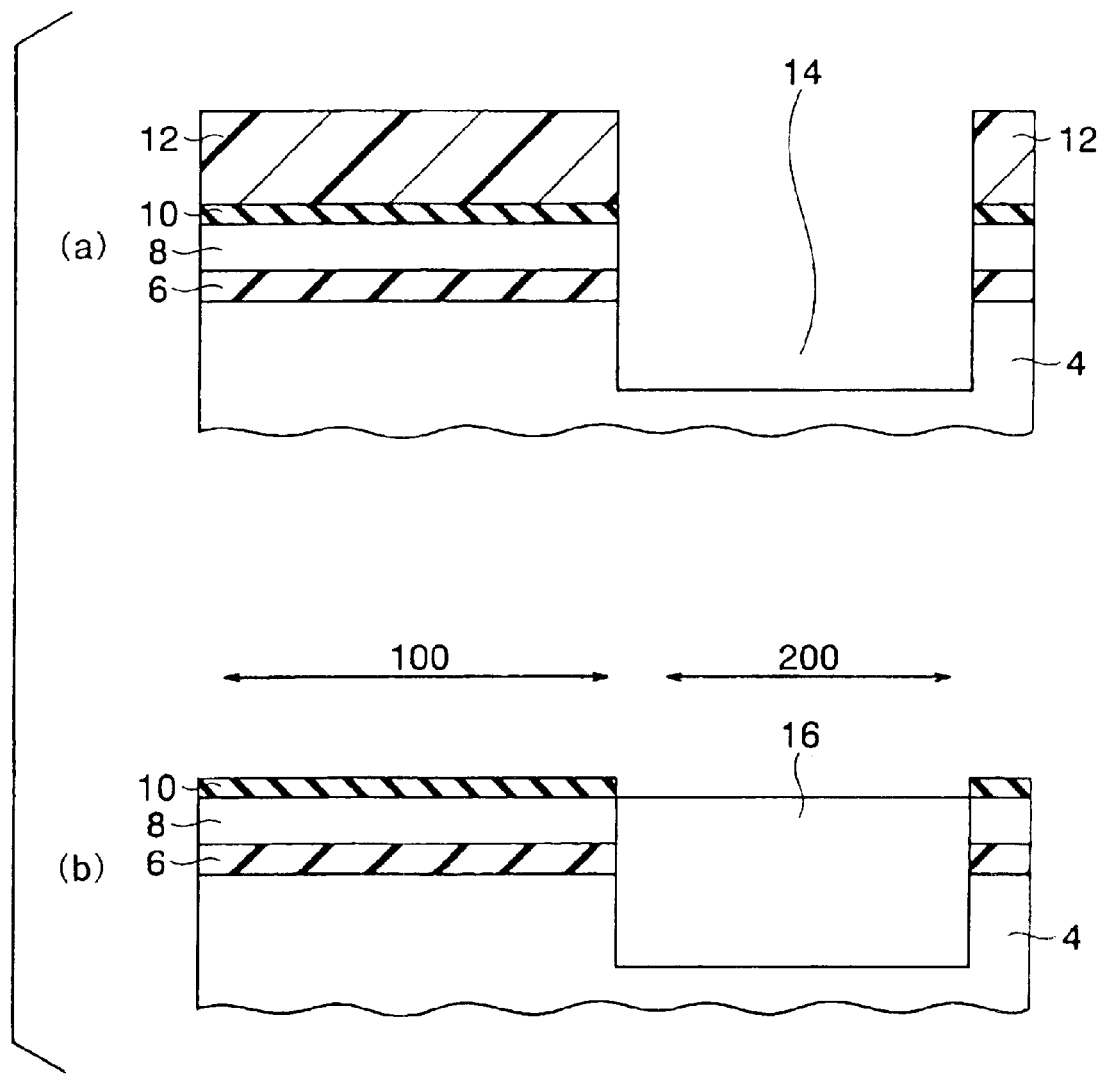
FIGS. 3(a) and 3(b) are sectional views of another stage of the manufacturing process with respect to the method of manufacturing a semiconductor device according to the second embodiment of the present invention.
Figure 4:
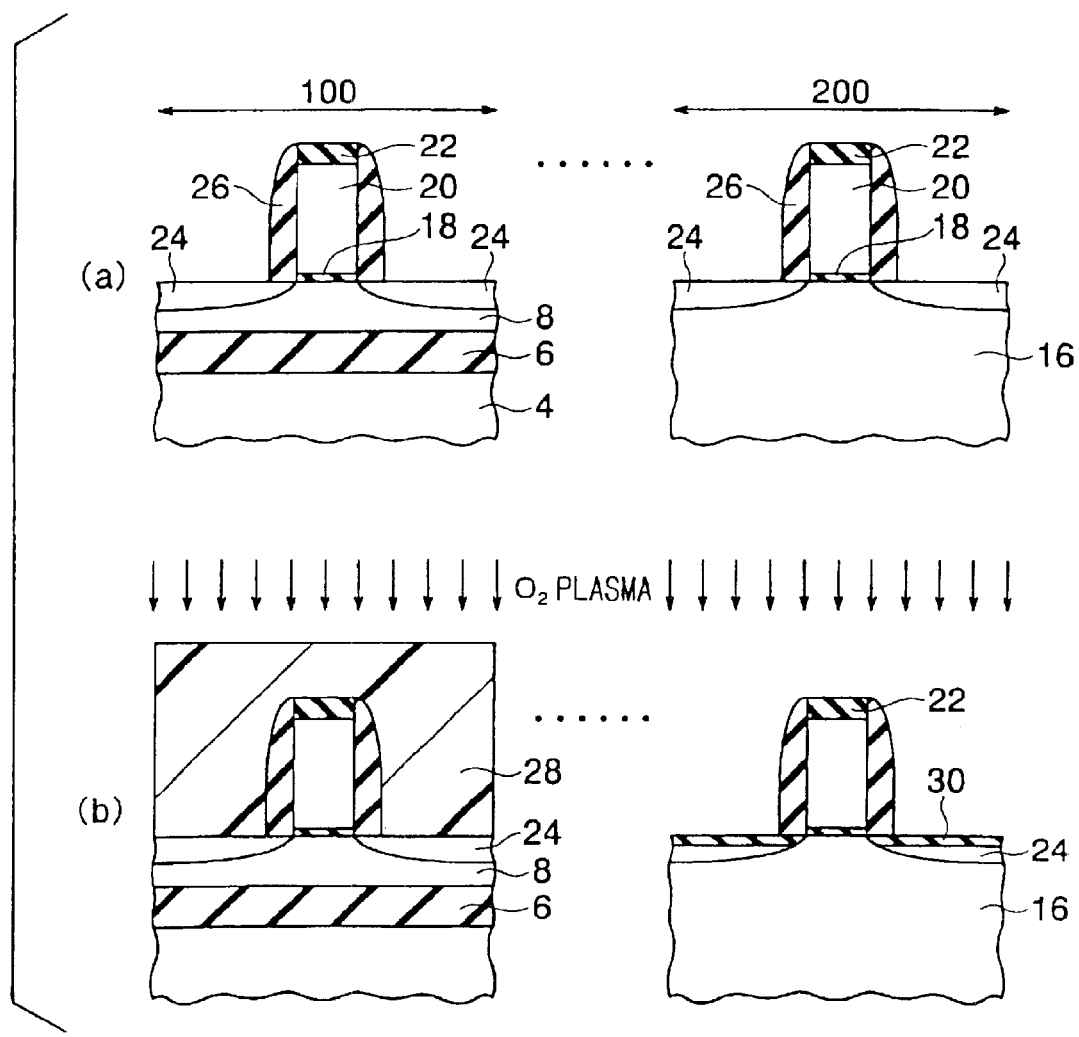
FIGS. 4(a) and 4(b) are sectional views of still another stage of the manufacturing process with respect to the method of manufacturing a semiconductor device according to the second embodiment of the present invention.
Figure 5:
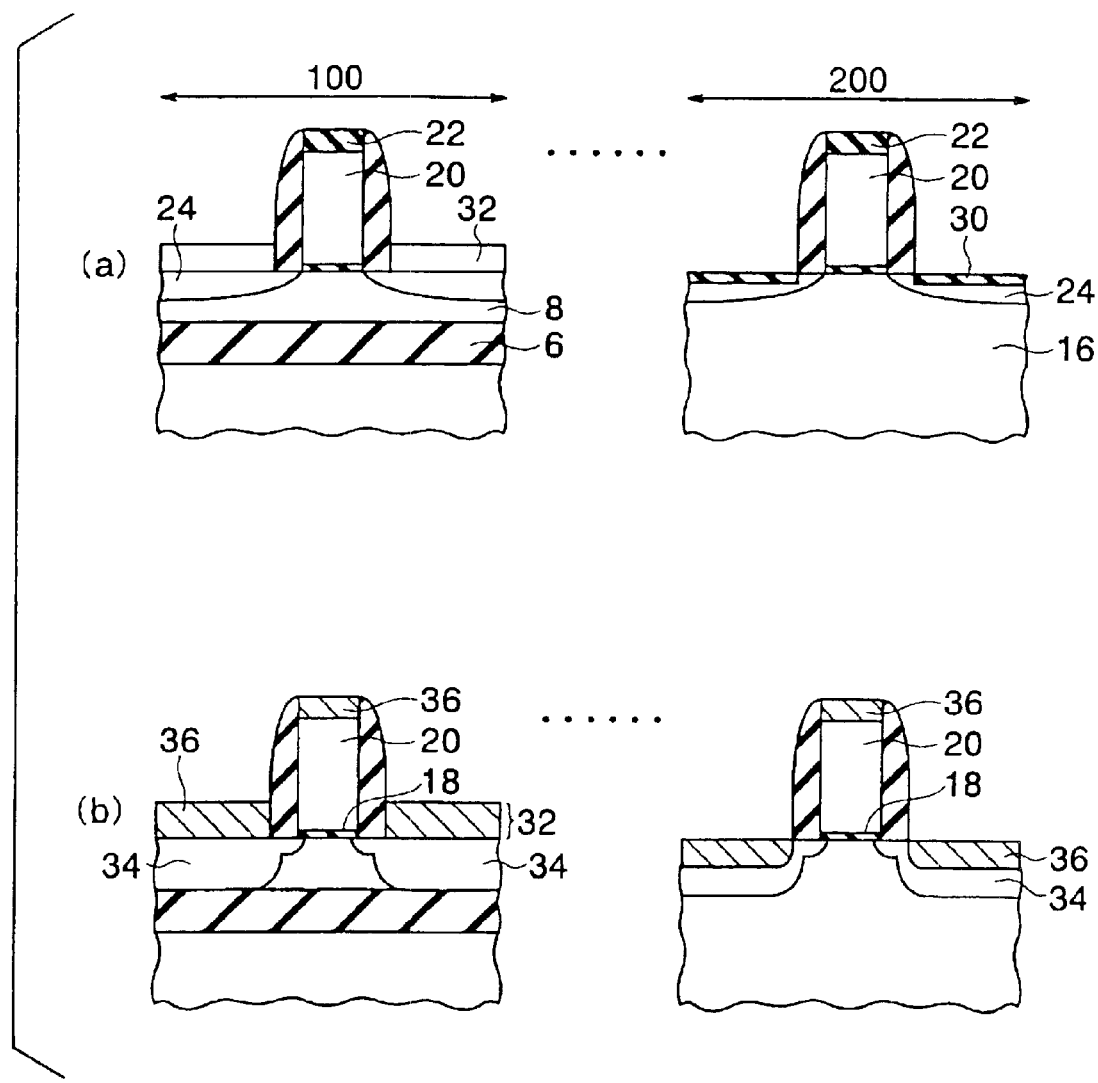
FIGS. 5(a) and 5(b) are sectional views of a further stage of the manufacturing process with respect to the method of manufacturing a semiconductor device according to the second embodiment of the present invention.

Hereinafter, embodiments of the present invention will be described in detail with reference to the accompanying drawings.

(First Embodiment)

FIG. 1 shows the structure of a semiconductor device according to a first embodiment of the present invention. The semiconductor device of this embodiment includes a first MOSFET having an elevated source/drain structure and formed in an SOI region 100 of a semiconductor substrate, and a second MOSFET having a non-elevated source/drain structure and formed in a bulk region 200. The first MOSFET is formed on a semiconductor layer 8 of an SOI substrate including a semiconductor layer 4, a buried oxide layer 6, and the semiconductor layer 8. The second MOSFET is formed on a semiconductor layer 16 of silicon, which is formed by removing a portion of the SOI substrate with the buried oxide layer, and then filling that portion with silicon.

The first MOSFET includes a gate electrode 20 formed on the semiconductor layer 8 via a gate insulating layer 18, a channel region formed in the semiconductor layer 8 immediately below the gate electrode 20, a diffusion layer 34 constituting source and drain regions formed at both the sides of the channel region in the semiconductor layer 8, a shallow diffusion layer (hereinafter also referred to as "extension layer") 24 formed between the diffusion layer 34 and the channel region in the semiconductor layer 8 and having a lower impurity concentration than the diffusion layer 34, a gate sidewall 26 of an insulating material formed at the side portion of the gate electrode 20, an epitaxial layer 32 formed on the diffusion layer 34, and a silicide layer 36 formed at the upper portion of the epitaxial layer 32 and at the top of the gate electrode 20. That is, the first MOSFET has an elevated source/drain structure.

The second MOSFET includes a gate electrode 20 formed on the semiconductor layer 16 via a gate insulating layer 18, a channel region formed in the semiconductor layer 16 immediately below the gate electrode 20, the diffusion layer 34 serving as source/drain regions formed at both the sides of the channel region in the semiconductor layer 16, a shallow extension layer 24 formed between the diffusion layer 34 and the channel region in the semiconductor layer 16 and having a lower impurity concentration than the diffusion layer 34, a gate sidewall 26 of an insulating material formed at the side portion of the gate electrode 20, and a silicide layer 36 formed on the diffusion layer 34 and at the top of the gate electrode 20.

As described above, according to this embodiment, the SOI region 100 and the bulk region 200 are formed on the same semiconductor substrate; the first MOSFET having an elevated source/drain structure is formed in the SOI region 100, and the second MOSFET having a non-elevated source/drain structure is formed in the bulk region 200. Accordingly, the optimization of epitaxial layer can be made depending on the characteristics of each region, thereby inhibiting the degradation of device characteristics and circuit performance even if miniaturization of devices is carried out.

Generally, when a silicide layer is formed over source/drain regions of a MOSFET formed in an SOI region, it is difficult to form a good silicide layer because of a thin SOI layer and the existence of a buried insulating layer, which limit the supply of silicon. However, in this embodiment, since the MOSFET formed in the SOI region has an elevated source/drain structure, it is possible to supply sufficient silicon to form a good silicide layer.

Although the first and second MOSFETs are of the same conductive type in this embodiment, they may be of different conductive types.

(Second Embodiment)

Next, a method of manufacturing a semiconductor device according to a second embodiment of the present invention will be described with reference to FIGS. 2 to 5. The method of this embodiment is for manufacturing the semiconductor device of the first embodiment shown in FIG. 1, and the sectional views of the manufacturing process of this embodiment are shown in FIGS. 2 to 5.

As shown in FIG. 2(a), an SOI substrate 2, in which the buried oxide layer 6 is formed between the semiconductor layer 4 and the semiconductor layer 8 (hereinafter also referred to "SOI layer 8"), is used as the substrate of this embodiment. Then, as shown in FIG. 2(b), after a silicon nitride layer 10 is deposited on the semiconductor layer 8, a photoresist is applied to the silicon nitride layer 10, which is then patterned to form a resist pattern 12 having an opening 13 in a region to become the bulk region 200. Subsequently, the silicon nitride layer 10 is patterned by the RIE (Reactive Ion Etching) method using the resist pattern 12 as a mask.

Then, as shown in FIG. 3(a), the semiconductor layer 8, the buried oxide layer 6, and the semiconductor layer 4 are etched by the RIE method using the resist pattern 12 and the silicon nitride layer 10 as masks, to form an opening 14 in the region of the SOI substrate 2 to become a bulk region. Subsequently, after the resist pattern 12 is removed, a selective growth of the silicon layer 16 is performed so as to fill the opening 14, as shown in FIG. 3(b). Thereafter, the SOI region 100 and the bulk region 200 are formed by removing the silicon nitride layer 10.

If, for example, a DRAM is formed in the bulk region 200, and a logical circuit is formed in the SOI region 100, first memory cells of the DRAM are formed, and then MOSFETs constituting a periphery circuit of the DRAM and MOSFETs constituting the above-described logical circuit are formed. In this case, a device isolation insulating layer isolating devices is formed by the STI (Shallow Trench Isolation) method to constitute an STI (Shallow Trench Insulator) with a depth of 2,000 Å to 3,500 Å (1 Å is $10^{-10}$ m).

Next, the process of forming a MOSFET constituting the periphery circuit of the DRAM and the process of forming a MOSFET constituting the above-described logical circuit will be described. First, the gate insulating layer 18 with a thickness of 5 Å to 60 Å is formed on the semiconductor layers 8 and 16 by the thermal oxidation method or the LPCVD (Low Pressure Chemical Vapor Deposition) method (FIG. 4(a)). Subsequently, a gate electrode material layer of polycrystalline silicon or polycrystalline silicon-germanium with a thickness of 500 Å to 2,000 Å is formed on the gate insulating layer 18. Then, a cap material layer is deposited on the gate electrode material layer so that no epitaxial growth is performed. This cap material layer may be omitted. A silicon oxide layer or a silicon nitride layer is used as the cap material layer. Next, a cap layer 22 and the gate electrode 20 are formed by patterning the cap material layer and the gate electrode material layer. Then, the extension layer 24 is formed in the semiconductor layers 8 and 16 by the ion-implantation of impurities using the gate electrode 20 as a mask. Thereafter, the gate sidewall 26 of an insulating material is formed at the side portion of the gate electrode 20 using the known techniques.

Next, as shown in FIG. 4(b), with only the SOI region 100 being covered by a photoresist layer 28, a silicon oxide layer 30 having a thickness of 50 Å to 100 Å is formed on the semiconductor layer 16 by oxidizing the surface of the bulk region 200 by $O_2$ plasma. The oxide layer 30 forming conditions using $O_2$ plasma is: High-frequency Power=500 W, Pressure=0.2 Torr (=0.2×133.322 Pa), Treatment Temperature=0° C.–300° C., and Treatment Time=30 to 180 seconds.

Next, as shown in FIG. 5(a), after the resist layer 28 is removed, the native oxide layer is removed by dilute hydrofluoric acid, and the monocrystal layer 32 of silicon or silicon-germanium is formed by the epitaxila growth method. At this time, in the bulk region 200, dilute hydrofluoric acid treatment is performed so as to maintain the oxide layer 30 formed by $O_2$ plasma, which means that no monocrystal layer, which should otherwise be formed by the epitaxial growth, is formed in the bulk region 200. The selective growth of monocrystal silicon is performed by heating the silicon layer 24 in hydrogen atmosphere at the high temperature of 800° C. or more, and to supply the reaction gas such as $SiH_4$, $SiH_2Cl_2SiHCl_3$, HCl, etc., together with hydrogen to the substrate on which the monocrystal silicon is grown. The selective growth of monocrystal silicon-germanium is performed by heating the silicon layer 24 in hydrogen atmosphere at the temperature of 50° C. to 800° C., and to supply the reaction gas such as $GeH_4$, $SiH_2Cl_2$, HCl, etc., together with hydrogen to the substrate on which the monocrystal silicon-germanium is grown. After the monocrystal layer 32 is formed, the oxide layer 30 in the bulk region 200 is removed by the dilute hydrofluoric acid treatment. If the cap layer 22 on the gate electrode 20 is a silicon oxide layer, the cap layer 22 is also removed at this time. If not, after the oxide layer 30 is removed, the cap layer 22 is removed.

Next, as shown in FIG. 5(b), the high concentration diffusion layer 34 is formed by the ion-implantation of impurities into the semiconductor layers 8 and 16 in the SOI region 100 and the bulk region 200. Then, using the known techniques, silicidation is performed on the upper portion of the monocrytal layer 32 and the gate electrode 20 in the SOI region and the exposed surface of the semiconductor layer 16 in the bulk region 200 to form the silicide layer 36. The silicide layer 36 is formed by using one of the metals capable of forming silicide, such as Ti, Co, Ni, Pd, and W. The gate electrode 20 of polycrystalline silicon may have a polymetal structure in which a barrier metal of TiN or WN is formed thereon, and W is deposited on the barrier metal.

As described above, according to this embodiment, the Sol region 100 and the bulk region 200 are formed on the same semiconductor substrate; the MOSFET having an elevated source/drain structure is formed in the SOI region 100 and the MOSFET having a non-elevated source/drain structure is formed in the bulk region 200. Accordingly, the optimization of epitaxial layer can be made depending on the characteristics of each region, thereby inhibiting the degradation of device characteristics and circuit performance even if miniaturization of devices is carried out.

Generally, when a silicide layer is formed over source/drain regions of a MOSFET formed in an SOI region, it is difficult to form a good silicide layer because of a thin SOI layer and the existence of a buried insulating layer, which limit the supply of silicon. However, in this embodiment, since the MOSFET formed in the SOI region has an elevated source/drain structure, it is possible to supply sufficient silicon to form a good silicide layer.

Further, conventionally, whether an epitaxial growth layer is formed or not has been determined, or the thickness of an epitaxial layer has been changed in a wafer by having a multiple sidewall structure and etching only a portion of the sidewalls, or by depositing a silicon nitride layer or a silicon oxide layer and etching only a portion thereof. In this embodiment, however, such modification can be performed by the use of O$_2$ plasma process.

(Third Embodiment)

Figure 7:
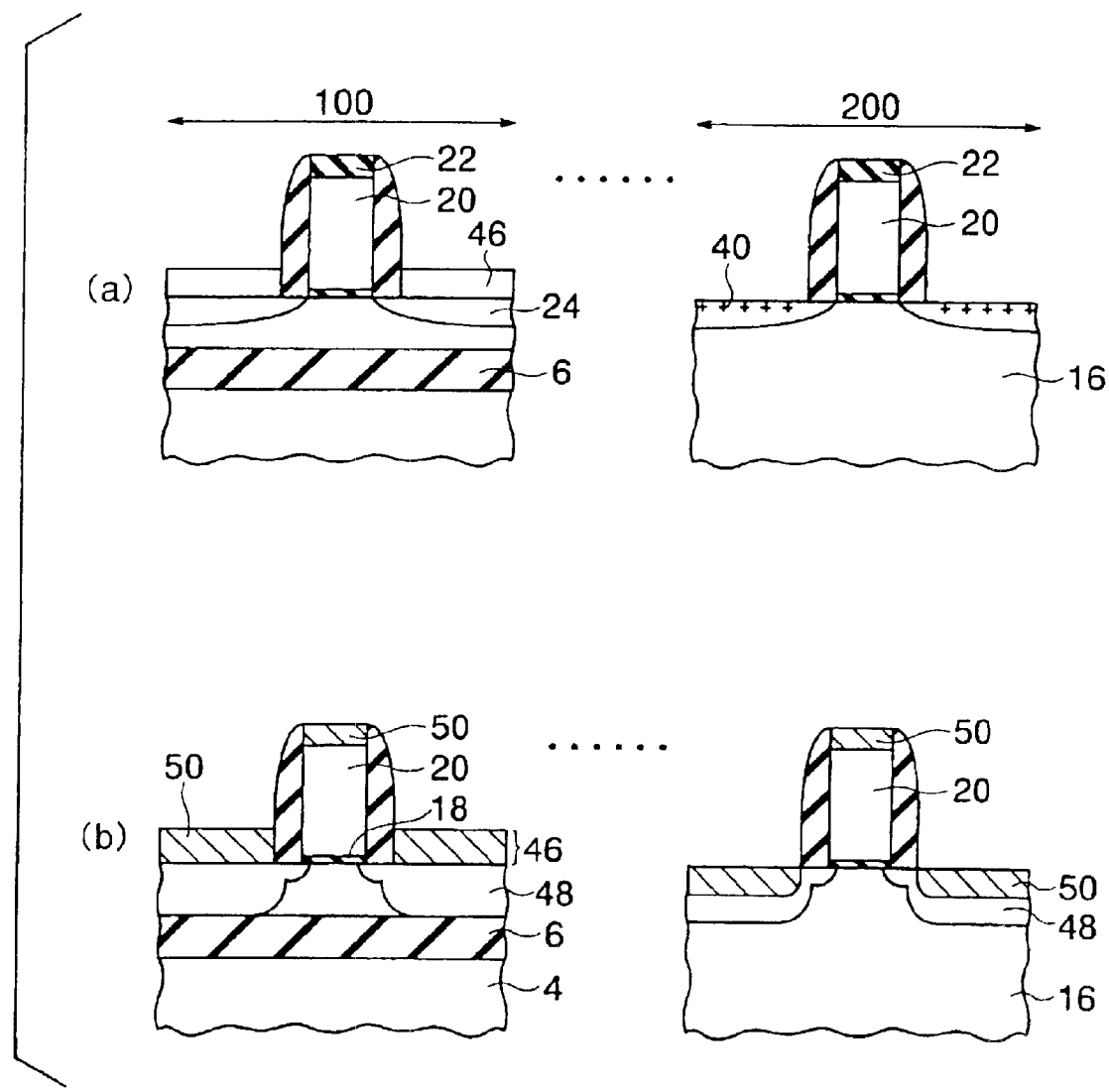
FIGS. 7(a) and 7(b) are sectional views of another stage of the manufacturing process with respect to the method of manufacturing a semiconductor device according to the third embodiment of the present invention.

Next, a method of manufacturing a semiconductor device according to a third embodiment of the present invention will be described with reference to FIGS. 6 and 7. The method according to the third embodiment is for manufacturing the semiconductor device of the first embodiment, but through the process different from that of the second embodiment. FIGS. 6 and 7 show the manufacturing process of the method of this embodiment.

As shown in FIG. 6(a), the process of the third embodiment is the same as that of the second embodiment until the extension layer 24 is formed. After the formation of the extension layer 24, the sidewall 26 of an insulating material is formed at the side portion of the gate electrode 20 by first depositing an insulating layer all over the extension layer 24 and then etching the insulating layer by the RIE method. At this time, RIE is performed by using a carbon-containing active gas such that Si—C bonds 40 are formed in the portion near the surface of the extension layer 24 in the SOI region 100 and the bulk region 200 when the gate sidewall 26 is formed. The Si—C bonds 40 may be formed in the portion near the surface of the extension layer 24 after the formation of the gate sidewall 26 by implanting carbon ions.

Next, as shown in FIG. 6(b), with only the bulk region 200 being covered by a resist pattern 42, the surface of the extension layer 24 is oxidized by O$_2$ plasma to cleave the Si—C bonds in the SOI region, thereby forming an oxide layer 44. On the other hand, the Si—C bonds 40 remain in the bulk region 200.

After the resist pattern 42 of the bulk region 200 is removed, the oxide layer 44 of the SOI region 100 is removed through the dilute hydrofluoric acid treatment. Then, a monocrystal layer 46 of silicon or silicon-germanium is formed by epitaxial growth, as shown in FIG. 7(a). At this time, no epitaxila layer is formed in the bulk region 200 since the Si—C bonds 40 prevent epitaxial growth. Thereafter, the cap layer 22 on the gate electrode 20 is removed.

Next, as shown in FIG. 7(b), a high concentration diffusion layer 48 is formed in the semiconductor layers 8 and 16. Then, silicidation of the top of the monocrystal layer 46 and the gate electrode, and the surface of the extension layer 24 in the bulk region 200 is performed to form a silicide layer 50. Although the Si—C bonds have remained at the surface of the extension layer 24 in the bulk region 200, there is no problem in the conductivity since the silicide layer 50 is formed.

As described above, according to this embodiment, the SOI region 100 and the bulk region 200 are formed on the same semiconductor substrate; the MOSFET having an elevated source/drain structure is formed in the SOI region 100 and the MOSFET having a non-elevated source/drain structure is formed in the bulk region 200. Accordingly, the optimization of epitaxial layer can be made depending on the characteristics of each region, thereby inhibiting the degradation of device characteristics and circuit performance even if miniaturization of device is carried out.

Generally, when a silicide layer is formed over source/drain regions of a MOSFET formed in an SOI region, it is difficult to form good silicide layer because of a thin SOI layer and the existence of a buried insulating layer. However, in this embodiment, since the MOSFET formed in the SOI region has an elevated source/drain structure, it is possible to supply sufficient silicon to form a good silicide layer.

Further, conventionally, whether an epitaxial growth layer is formed or not has been determined, or the thickness of an epitaxial layer has been changed in a wafer by having a multiple sidewall structure and etching only a portion of the sidewalls, or by depositing a silicon nitride layer or a silicon oxide layer and etching only a portion thereof. In this embodiment, however, such modicifation can be performed by the use of the O$_2$ plasma process.

(Fourth Embodiment)

FIG. 8 shows the structure of a semiconductor device according to a fourth embodiment of the present invention. The semiconductor device in this embodiment includes a first MOSFET formed in an SOI region 100 of a semiconductor substrate and having a relatively thick epitaxial growth layer, and a second MOSFET formed in a bulk region 200 of the same semiconductor substrate and having a relatively thin epitacial layer. The first MOSFET is formed on a semiconductor layer 8 of an SOI substrate including a semiconductor layer 4, a buried oxide layer 6, and the semiconductor layer 8. The second MOSFET is formed on a semiconductor layer 16 of silicon formed by removing a portion of the SOI substrate with the buried oxide layer, and then filling that portion with silicon.

The first MOSFET includes a gate electrode 20 formed on the semiconductor layer 8 via an insulating layer 18, a channel region formed in the semiconductor layer 8 immediately below the gate electrode 20, a diffusion layer 34 constituting source and drain formed at both the sides of the channel region in the semiconductor layer 8, an extension layer 24 formed between the diffusion layer 34 and the channel region in the semiconductor layer 8 and having a lower impurity concentration than the diffusion layer 34, a gate sidewall 26 of an insulating material formed at the side portion of the gate electrode 20, an epitaxial layer 32 formed on the diffusion layer 34, and a silicide layer 36 formed on the epitaxial layer 32 and at the top of the gate electrode 20. That is, the first MOSFET has an elevated source/drain structure.

The second MOSFET includes a gate electrode 20 formed on the semiconductor layer 16 via a gate insulating layer 18, a channel region formed in the semiconductor layer 16 immediately below the gate electrode 20, a diffusion layer 34 constituting source and drain formed at the sides of the channel region in the semiconductor layer 16, an extension layer 24 formed between the diffusion layer 34 and the channel region in the semiconductor layer 16 and having a lower impurity concentration than the diffusion layer 34, gate sidewalls 26 of an insulating material formed at the sides of the gate electrode 20, an epitaxial layer 33 thinner than the epitaxial layer 32 of the SOI region 100, formed on the diffusion layer 34, and a silicide layer 36 formed at the top of the epitaxila layer 33 and the gate electrode 20.

As described above, according to this embodiment, the SOI region 100 and the bulk region 200 are formed on the same semiconductor substrate; the first MOSFET including a relatively thick epitaxial layer is formed in the SOI region 100 and the second MOSFET including a relatively thin epitaxial layer is formed in the bulk region 200. Accordingly, the optimization of epitaxial layer can be made depending on the characteristics of each region, thereby inhibiting the degradation of device characteristics and circuit performance even if miniaturization of devices is carried out.

Generally, when a silicide layer is formed over source/drain regions of a MOSFET formed in an SOI region, it is difficult to form a good silicide layer because of a thin SOI layer and the existence of a buried insulating layer, which limit the supply of silicon. However, in this embodiment, since the MOSFET formed in the SOI region has an elevated source/drain structure, it is possible to supply sufficient silicon to form a good silicide layer.

Although the first MOSFET and the second MOSFET are of the same conductive type in this embodiment, they may be of different conductive types.

(Fifth Embodiment)

FIG. 9 shows the structure of a semiconductor device according to a fifth embodiment of the present invention. The semiconductor device in this embodiment includes a first MOSFET (e.g., a p-channel MOSFET) formed in a first region 300 of a bulk substrate and having a relatively thick epitaxial growth layer, and a second MOSFET (e.g., an n-channel MOSFET) formed in a second region 400 of the bulk substrate and having a relatively thin epitaxial layer. The first MOSFET is formed on an n-type semiconductor layer 52 on the bulk substrate. The second MOSFET is formed on a p-type semiconductor layer 51 on the bulk substrate.

The first MOSFET includes a gate electrode 56 formed on the semiconductor layer 52 via a gate insulating layer 54, a channel region formed in the semiconductor layer 52 immediately below the gate electrode 56, a diffusion layer 72 constituting source and drain regions formed at both the sides of the channel region in the semiconductor layer 52, an extension layer 60 formed between the diffusion layer 72 and the channel region in the semiconductor layer 52 and having a lower impurity concentration than the diffusion layer 72, a gate sidewall 62 of an insulating material formed at the side portion of the gate electrode 56, an epitaxial layer 68 formed on the diffusion layer 72, and a silicide layer 74 formed on the epitaxial layer 68 and at the top of the gate electrode 56. That is, the first MOSFET has an elevated soured/drain structure.

The second MOSFET includes a gate electrode 57 formed on the semiconductor layer 51 via a gate insulating layer 54, a channel region formed in the semiconductor layer 51 immediately below the gate electrode 57, a diffusion layer 71 constituting source and drain regions formed at both the sides of the channel region in the semiconductor layer 51, an extension layer 61 formed between the diffusion layer 71 and the channel region in the semiconductor layer 51 and having a lower impurity concentration than the diffusion layer 71, a gate sidewall 62 of an insulating material formed at the side portion of the gate electrode 57, an epitaxial layer 69 thinner than the epitaxial layer 68 of the first region and formed on the diffusion layer 71, and a silicide layer 74 formed at the top of the epitaxial layer 69 and the gate electrode 57.

As described above, according to this embodiment, the first MOSFET including a relatively thick epitaxial layer is formed in the first region 300 of the bulk substrate and the second MOSFET including a relatively thin epitaxial layer is formed in the second region 400. Accordingly, the optimization of epitaxial layer can be made depending on the characteristics of each region, thereby inhibiting the degradation of device characteristics and circuit performance even if miniaturization of devices is carried out.

(Sixth Embodiment)

Figure 10:
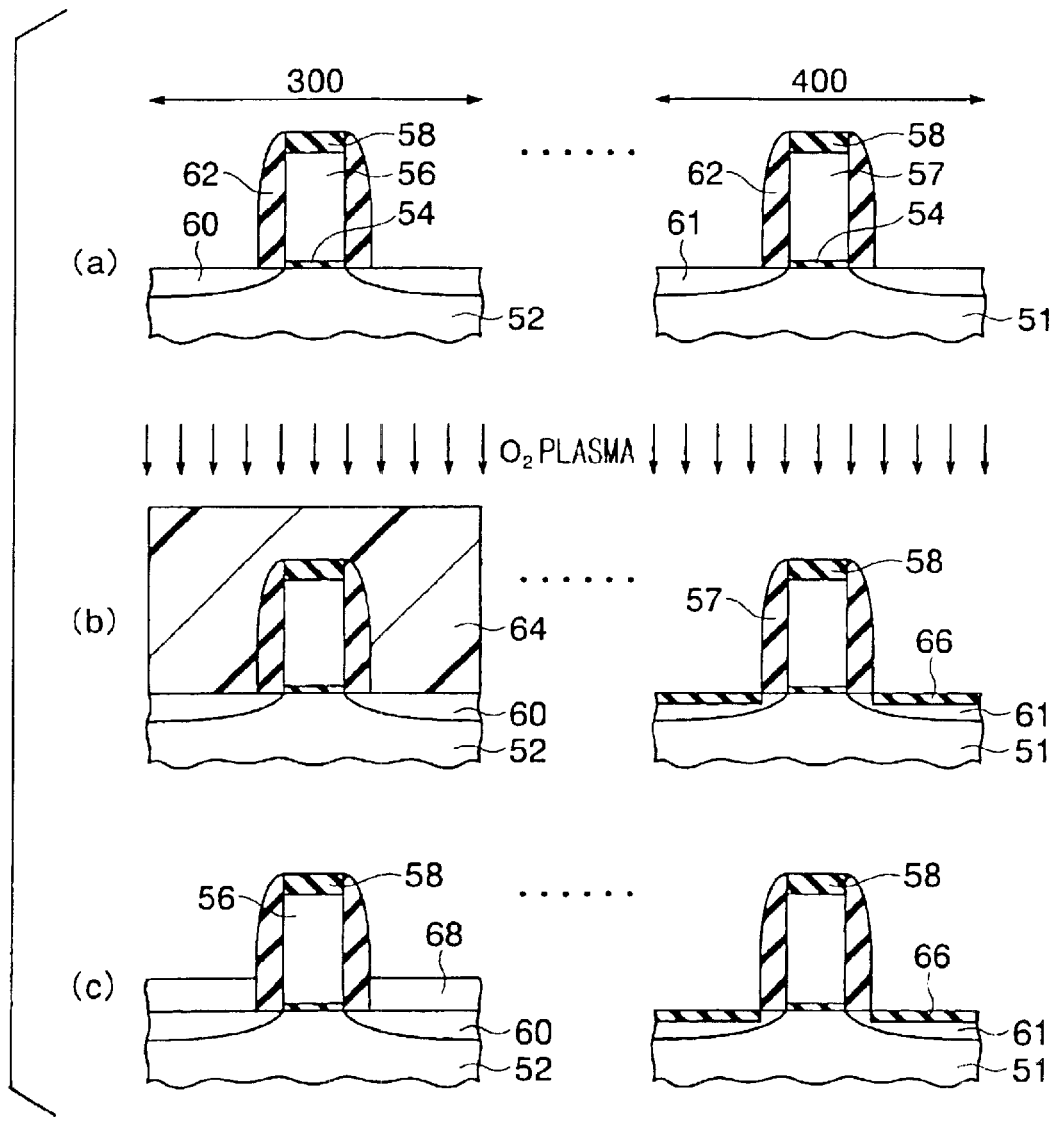
FIGS. 10(a), 10(b) and 10(c) are sectional views of a stage of the manufacturing process with respect to a method of manufacturing a semiconductor device according to a sixth embodiment of the present invention.

Next, a method of manufacturing a semiconductor device according to a sixth embodiment of the present invention will be described with reference to FIGS. 10 and 11. The method of this embodiment is for manufacturing the semiconductor device of the fifth embodiment. FIGS. 10 and 11 show the sectional views of the manufacturing process.

First, as shown in FIG. 10(a), the n-type semiconductor layer 52 is formed in the first region 300 of the bulk substrate, and the p-type semiconductor layer 51 is formed in the second region 400. Device isolation is performed between the semiconductor layers 51 and 52 with a device isolation insulating layer (e.g., STI). Then, the gate electrodes 57 and 56 are formed via the gate insulating layer 54 on the semiconductor layers 51 and 52. At this time, a cap layer 58 preventing the growth of epitaxial layer on the gate electrodes 57 and 56 is also formed. Thereafter, the n-type extension layer 61 is formed through the ion implantation of n-type impurities into the semiconductor layer 51 using the gate electrode 57 as a mask, and the p-type extension layer 60 is formed through the ion implantation of p-type impurities into the semiconductor layer 52 using the gate electrode 56 as a mask. Subsequently, the gate sidewall 62 of an insulating material is formed at the side portions of the gate electrodes 56 and 57.

Next, as shown in FIG. 10(b), with only the first region 300 being covered by a resist pattern 64, an oxide layer 66 is formed by oxidizing the surface of the semiconductor layer 51 of the second region 400 by $O_2$ plasma. Preferably, the thickness of the oxide layer 66 is from 50 Å to 100 Å.

Next, after the resist pattern 64 is removed, the native oxide layer is removed by the use of dilute hydrofluoric acid. Then, a monocrystal layer 68 of silicon or silicon-germanium is formed by epitaxial growth, as shown in FIG. 10(c). When the native oxide layer is removed, the dilute hydrofluoric acid treatment is performed such that the oxide layer 66 formed by $O_2$ plasma remains in the region where the thick epitaxial layer is not formed (in this case, the second region 400). Since the oxide layer 66 remains in the region 400, no epitaxial growth layer 68 is formed in this region.

Then, the oxide layer 66 formed by $O_2$ plasma is removed by using dilute hydrofluoric acid again. Thereafter, as shown in FIG. 11(a), the epitaxial layer 68 is further grown in the first region 300 and an epitaxial layer 69 is newly formed through the epitaxial growth method. Thus, it is possible to change the thickness of epitaxial layer in each region. If the epitaxial growth is stopped before the state of FIG. 11(a), it is possible to distinguish the region where an epitaxial layer is formed from the region where no epitaxial layer is formed. Then, the p-type high concentration diffusion layer 72 constituting source and drain regions is formed in the semiconductor layer 52, and the n-type high concentration diffusion layer 71 constituting source and drain regions is formed in the semiconductor layer 51. After that, the silicide layer 74 is formed to complete the fabrication of the semiconductor device of this embodiment (FIG. 11(b)).

As described above, according to this embodiment, the p-channel MOSFET including a relatively thick epitaxial layer is formed in the first region of the bulk substrate and the n-channel MOSFET including a relatively thin epitaxial layer is formed in the second region. Accordingly, the optimization of epitaxial layer can be made depending on the characteristics of each region, thereby inhibiting the degradation of device characteristics and circuit performance even if miniaturization of devices is carried out.

Further, conventionally, whether an epitaxial growth layer is formed or not has been determined, or the thickness of an epitaxial layer has been changed in a wafer by having a multiple sidewall structure and etching only a portion of the sidewalls, or by depositing a silicon nitride layer or a silicon oxide layer and etching only a portion thereof. In this embodiment, however, such modification can be performed by the use of O₂ plasma process.

(Seventh Embodiment)

Figure 12:
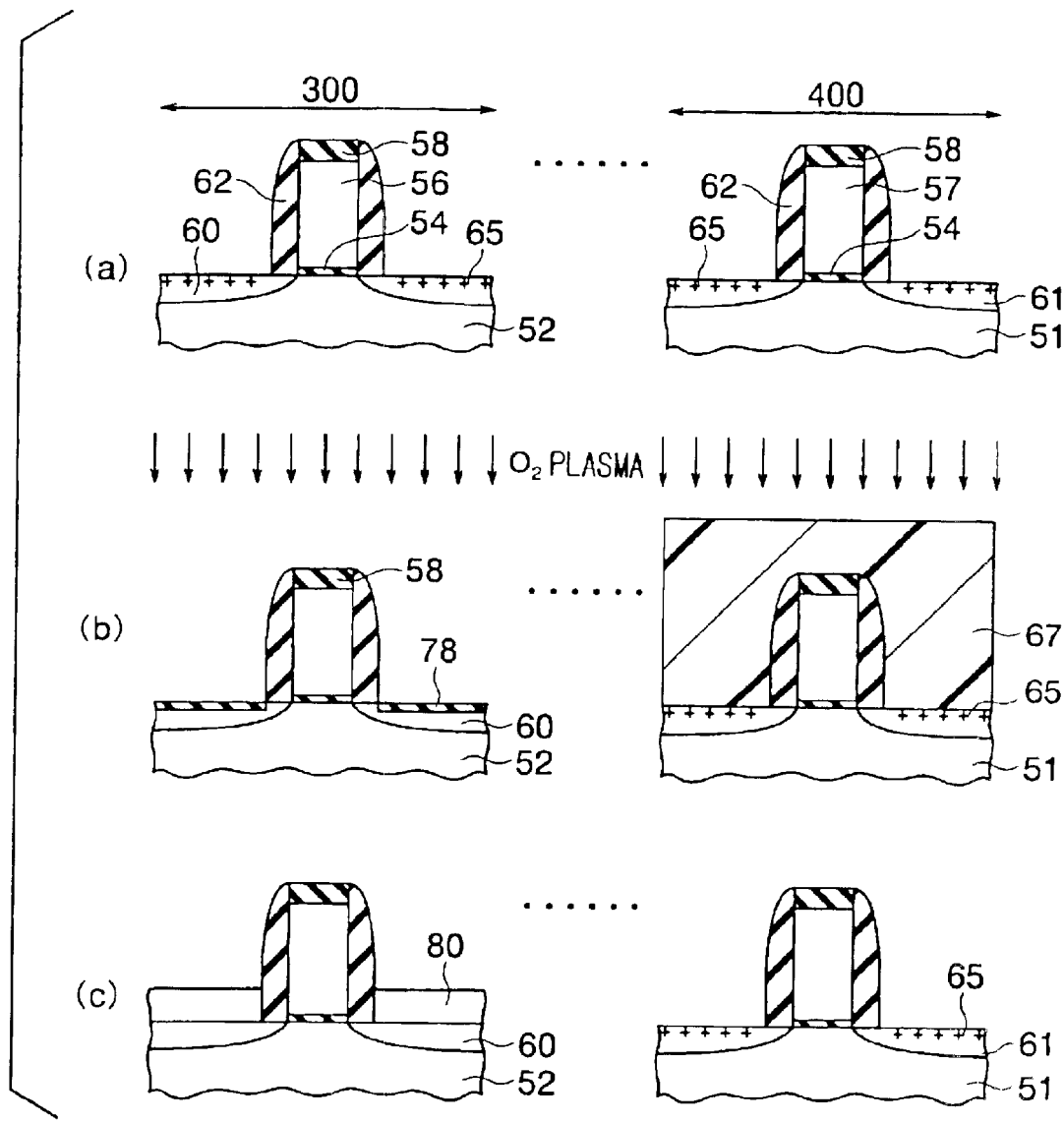
FIGS. 12(a), 12(b) and 12(c) are sectional views of a stage of the manufacturing process with respect to a method of manufacturing a semiconductor device according to a seventh embodiment of the present invention.
Figure 13:
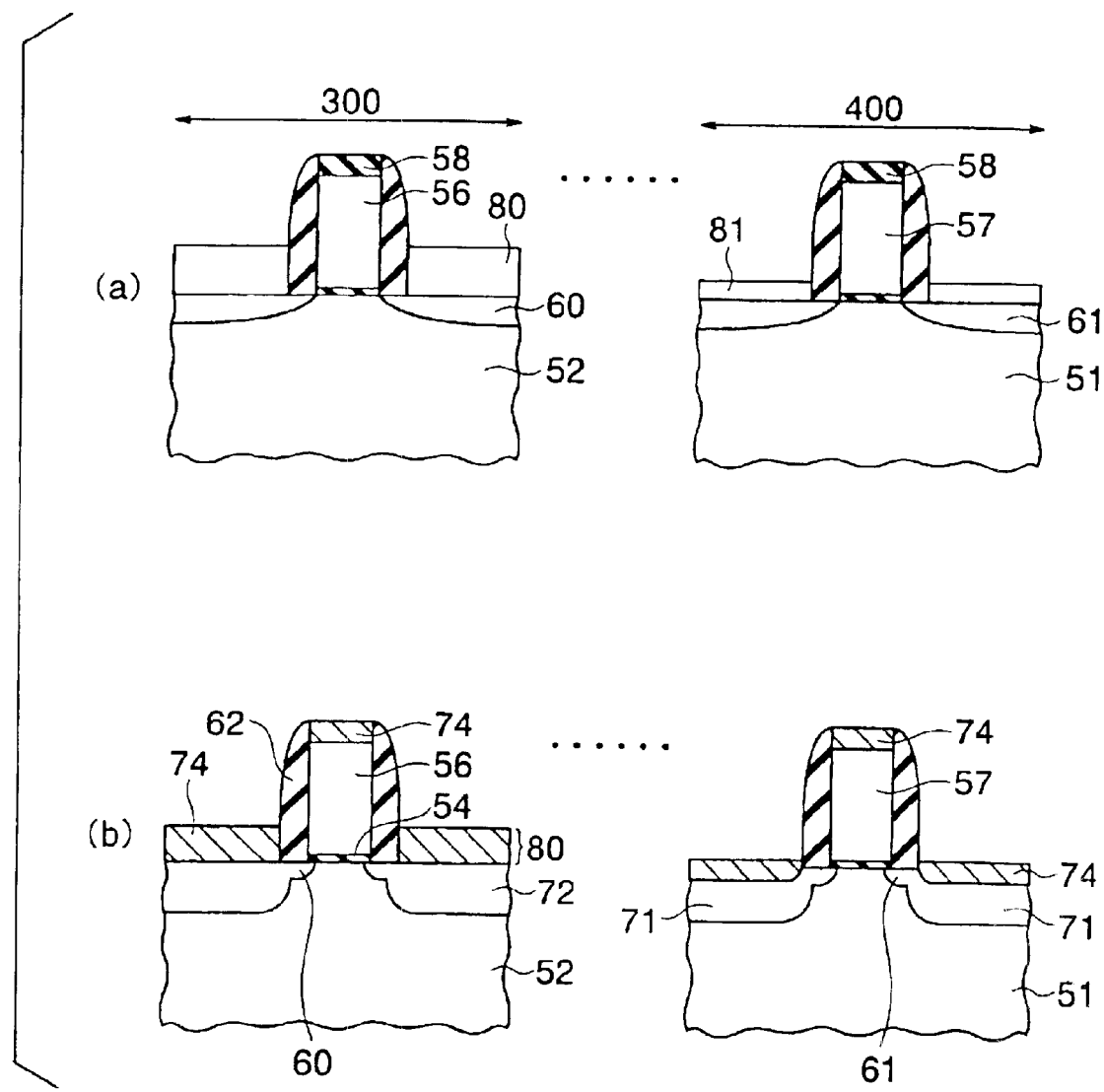
FIGS. 13(a) and 13(b) are sectional views of another stage of the manufacturing process with respect to the method of manufacturing a semiconductor device according to the seventh embodiment of the present invention.
Figure 15:
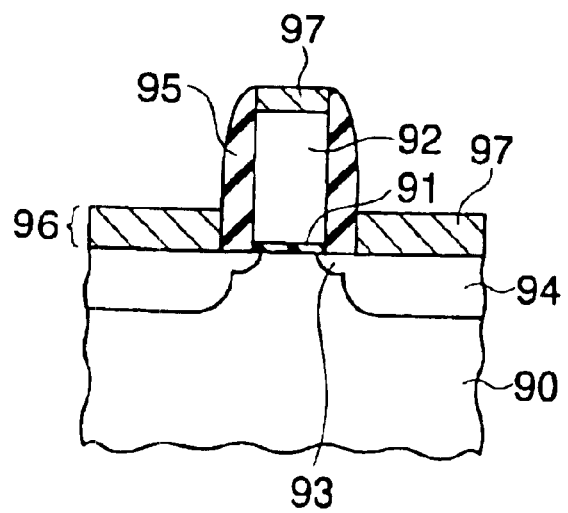
FIG. 15 is a conventional sectional view showing the structure of a semiconductor device having an elevated source/drain structure.

Next, a method of manufacturing a semiconductor device according to a seventh embodiment of the present invention will be described with reference to FIGS. 12 and 13. The method of this embodiment is for manufacturing the semiconductor device of the fifth embodiment in a process different from that of the sixth embodiment. FIGS. 12 and 13 show the sectional views of the manufacturing process.

First, as shown in FIG. 12(*a*), the n-type semiconductor layer 52 is formed in the first region 300 of the bulk substrate, and the p-type semiconductor layer 51 is formed in the second region 400. Device isolation is performed between the semiconductor layers 51 and 52 by the use of a device isolation insulating layer (e.g., STI). Then, the gate electrodes 57 and 56 are formed on the semiconductor layers 51 and 52 via the gate insulating layer 54. At this time, the cap layer 58 preventing the growth of epitaxial layer on the gate electrodes 57 and 56 is also formed. Thereafter, the ion implantation of n-type impurities into the semiconductor layer 51 using the gate electrode 57 as a mask is performed to form the n-type extension layer 61, and the ion implantation of p-type impurities into the semiconductor layer 52 using the gate electrode 56 as a mask is performed to form the p-type extension layer 60. Subsequently, the gate sidewall 62 of an insulating material is formed at the side portions of the gate electrodes 56 and 57. When the gate sidewall 62 is formed, RIE is performed by the use of a carbon-containing active gas so that Si—C bonds 65 are formed in the extension layers 60 and 61. The Si—C bonds 65 may be formed in the extension layers 60 and 61 through the carbon ion implantation performed after the gate sidewall 62 is formed.

Then, as shown in FIG. 12(*b*), with only the region not requiring a thick epitaxial layer (in this case the second region 400) being covered by the resist pattern 67, the surface of the extension layer 60 in the first region 300 is oxidized by O₂ plasma. Accordingly, in the region 300 that requires a thick epitaxial layer, the Si—C bonds 65 are cleaved, and an oxide layer 78 is formed. On the other hand, in the region 400 that does not require any thick epitaxial layer, the Si—C bonds 65 remain in the extension layer 61.

Next, after the photoresist pattern 67 is removed, the oxide layer 78 is removed by the use of dilute hydrofluoric acid. Thereafter, as shown in FIG. 12(*c*), a monocrystal layer 80 of silicon or silicon-germanium is formed by the epitaxial growth method. At this time, no epitaxial growth layer is formed in the region 400 that requires no thick epitaxial layer since the Si—C bonds 65 prevent epitaxial growth. Subsequently, an oxide layer (not shown) is formed on the extension layer 61 and the Si—C bonds 65 in the extension layer 61 are removed by covering the first region 300 with a photoresist pattern (not shown) and oxidizing the extension layer 61 of the second region 400 with O₂ plasma. Then, the above oxide layer on the extension layer 61 is removed by the dilute hydrofluoric acid treatment.

Then, as shown in FIG. 13(*a*), the epitaxial layer 80 on the extension layer 60 in the first region is further grown and an epitaxial layer 81 is newly formed on the extension layer 61 in the second region by the epitaxial growth method. In this way, it is possible to change the thickness of epitaxial layer in each region. If the epitaxial growth is stopped before the state shown in FIG. 13(*a*), it is possible to distinguish the epitaxial region from the region where no epitaxial growth is performed.

Next, as shown in FIG. 13(*b*), after the cap layer 58 on the gate electrodes 56 and 57 is removed, the p-type high concentration diffusion layer 72 constituting source and drain regions is formed in the semiconductor layer 52 in the first region 300 and the n-type high concentration diffusion layer 71 constituting source and drain regions is formed in the semiconductor layer 51 in the second region 400. Subsequently, silicidation of the epitaxial layers 80 and 81 and the top portions of the gate electrodes 56 and 57 is performed to form the silicide layer 74.

As described above, according to this embodiment, the p-channel MOSFET including a relatively thick epitaxial layer is formed in the first region of the bulk substrate and the n-channel MOSFET including a relatively thin epitaxial layer is formed in the second region. Accordingly, the optimization of epitaxial layer can be made depending on the characteristics of each region, thereby inhibiting the degradation of device characteristics and circuit performance even if miniaturization of devices is carried out.

Further, conventionally, whether an epitaxial growth layer is formed or not has been determined, or the thickness of an epitaxial layer has been changed in a wafer by having a multiple sidewall structure and etching only a portion of the sidewalls, or by depositing a silicon nitride layer or a silicon oxide layer and etching only a portion thereof. In this embodiment, however, such modification can be performed by the use of O₂ plasma process.

(Eighth Embodiment)

FIG. 14 shows the structure of a semiconductor device according to an eighth embodiment of the present invention. In the semiconductor device of this embodiment, a p-channel MOSFET is formed in a first region 300 of a bulk substrate, and an n-channel MOSFET is formed in a second region 400. Further, the semiconductor device of this embodiment is obtained by replacing the n-channel MOSFET of the fifth embodiment shown in FIG. 9 with an n-channel MOSFET without having an elevated source/drain structure. That is, the silicide layer 74 is formed at the surface of the high concentration diffusion layer 71 of the n-channel MOSFET.

As described above, in the semiconductor device of this embodiment, the p-channel MOSFET having an elevated source/drain structure is formed in the first region 300 of the bulk substrate and the n-channel MOSFET having a non-elevated source/drain structure is formed in the second region 400. Accordingly, the optimization of epitaxial layer can be made depending on the characteristics of each region, thereby inhibiting the degradation of device characteristics and circuit performance even if miniaturization of devices is carried out.

As described above, according to the present invention, it is possible to inhibit the degradation of device characteristics and circuit performance even if miniaturization of devices is carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method of manufacturing a semiconductor device comprising:

forming a first gate electrode on a first semiconductor layer in a first region of a semiconductor substrate, and a second gate electrode on a second semiconductor layer in a second region of the semiconductor substrate;

forming a first diffusion layer in said first semiconductor layer using said first gate electrode as a mask, and a second diffusion layer in said second semiconductor layer using said second gate electrode as a mask; and selectively forming an epitaxial layer only on said first diffusion layer, wherein said first region is an SOI region, and said second region is a bulk region.

2. A method of manufacturing a semiconductor device comprising:

forming a first gate electrode on a first semiconductor layer in a first region of a semiconductor substrate, and a second gate electrode on a second semiconductor layer in a second region of the semiconductor substrate;

forming a first diffusion layer in said first semiconductor layer using said first gate electrode as a mask, and a second diffusion layer in said second semiconductor layer using said second gate electrode as a mask; and selectively forming an epitaxial layer only on said first diffusion layer, wherein said selective forming of the epitaxial layer includes:

forming an oxide layer on the surface of said second diffusion layer in said second region by emitting $O_2$ plasma with only said first region being masked; and subsequently forming said epitaxial layer by epitaxial growth on said first diffusion layer.

3. A method of manufacturing a semiconductor device comprising:

forming a first gate electrode on a first semiconductor layer in a first region of a semiconductor substrate, and a second gate electrode on a second semiconductor layer in a second region of the semiconductor substrate;

forming a first diffusion layer in said first semiconductor layer using said first gate electrode as a mask, and a second diffusion layer in said second semiconductor layer using said second gate electrode as a mask;

implanting carbon into said first and second diffusion layers, and selectively forming an epitaxial layer only on said first diffusion layer, wherein said selective forming of the epitaxial layer includes:

forming an oxide layer on the surface of said first diffusion layer in said first region by emitting $O_2$ plasma with only said second region being masked;

removing the mask, and then removing said oxide layer; and subsequently forming said epitaxial layer by epitaxial growth on said first diffusion layer.

4. The method of manufacturing a semiconductor device according to claim 3, wherein said implanting carbon is performed by forming first and second gate sidewalls at side portions of said first and second gate electrodes through the RIE method using carbon gas as an active gas.

* * * * *